(12) United States Patent
Zhang et al.

(10) Patent No.: US 11,029,344 B2
(45) Date of Patent: Jun. 8, 2021

(54) SENSITIVITY BASED THEVENIN INDEX FOR VOLTAGE STABILITY ASSESSMENT CONSIDERING N-1 CONTINGENCY

(71) Applicants: Xiaohu Zhang, San Jose, CA (US); Di Shi, San Jose, CA (US); Xiao Lu, Nanjing (CN); Zhehan Yi, San Jose, CA (US); Qibing Zhang, Nanjing (CN); Zhiwei Wang, San Jose, CA (US)

(72) Inventors: Xiaohu Zhang, San Jose, CA (US); Di Shi, San Jose, CA (US); Xiao Lu, Nanjing (CN); Zhehan Yi, San Jose, CA (US); Qibing Zhang, Nanjing (CN); Zhiwei Wang, San Jose, CA (US)

(73) Assignee: Geiri Co Ltd, State Grid Jiangxi Electric Power Co, State Grid Corp Of China, Geirina Inc., San Jose, CA (US)

( * ) Notice: Subject to any disclaimer, the term of this patent is extended or adjusted under 35 U.S.C. 154(b) by 500 days.

(21) Appl. No.: 16/108,188

(22) Filed: Aug. 22, 2018

(65) Prior Publication Data

US 2019/0137550 A1 May 9, 2019

Related U.S. Application Data

(60) Provisional application No. 62/582,805, filed on Nov. 7, 2017.

(51) Int. Cl.
*G01R 19/25* (2006.01)
*H02J 3/00* (2006.01)
(Continued)

(52) U.S. Cl.
CPC ....... *G01R 19/2513* (2013.01); *G05B 13/048* (2013.01); *H02J 3/00* (2013.01);
(Continued)

(58) Field of Classification Search
CPC ..... G01R 19/2513; G05B 13/048; H02J 3/00; H02J 13/00; H02J 3/001; H02J 2203/20;
(Continued)

(56) References Cited

U.S. PATENT DOCUMENTS

2017/0177016 A1* 6/2017 Chiang ............... G05F 1/12

FOREIGN PATENT DOCUMENTS

CN 102148510 A * 8/2011

OTHER PUBLICATIONS

Yuan, Haoyu, and Fangxing Li. "Hybrid voltage stability assessment (VSA) for N-1 contingency." Electric Power Systems Research 122 (2015). pp. 65-75. (Year: 2015).*

(Continued)

*Primary Examiner* — Kamini S Shah
*Assistant Examiner* — John E Johansen
(74) *Attorney, Agent, or Firm* — Patent Law Office PC; Bao Tran

(57) ABSTRACT

Systems and method are disclosed for monitor long-term voltage stability in a power system by estimating post-contingency operating point(s) considering PV-PQ transitions based on the current operating point; predicting a sensitivity based Thevenin index (STI) for each contingency using the estimated operating condition; and determining a voltage stability assessment (VSA) considering N-1 contingency.

13 Claims, 6 Drawing Sheets

(51) Int. Cl.
*H02J 13/00* (2006.01)
*G05B 13/04* (2006.01)

(52) U.S. Cl.
CPC ............... *H02J 13/00* (2013.01); *H02J 3/001* (2020.01); *H02J 2203/20* (2020.01)

(58) Field of Classification Search
CPC . H02J 13/0006; H02J 13/00002; Y02E 60/00; Y02B 90/20; Y04S 20/00; Y04S 10/30; Y04S 40/20
USPC .......................................................... 703/18
See application file for complete search history.

(56) References Cited

OTHER PUBLICATIONS

Zhao, Jinquan, Chao Zhou, and Gang Chen. "A novel bus-type extended continuation power flow considering remote voltage control." 2013 IEEE Power & Energy Society General Meeting. IEEE, 2013. pp. 1-5. (Year: 2013).*

\* cited by examiner

SENSITIVITY BASED THEVENIN INDEX FOR VOLTAGE STABILITY ASSESSMENT CONSIDERING N−1 CONTINGENCY

TECHNICAL FIELD

This invention is related to systems and methods to monitor the long-term voltage stability in a power system.

BACKGROUND

Due to the power market deregulation, the increasing demand of electricity consumptions and the massive integration of renewable energy resources, the aging power grid is under stress. In today's competitive power market, the transmission facilities are often operated close to their security limits, which results in compromised reliability. The construction of new transmission infrastructure is one approach to relieve the transmission burden, but the environmental issues and long construction time make this option difficult. Among the security issues, voltage stability is one of the major concerns for the system operator. It usually starts from a local bus or area but may propagate to a system-wide stability problem. Thus, to maintain a reliable operation of electric power system, it is of great importance for the system operators to accurately and timely assess the voltage stability margin, i.e., the distance between the current operating point and the voltage collapse point.

The model-based approaches, i.e., continuation power flow (CPF) or time-domain simulation, are one group of methods to monitor the voltage stability margin. One advantage of the model-based approaches is that they can not only provide the voltage stability margin for the current operating point, but also analyze the impacts brought by the what if scenarios such as N−1 contingencies. Nevertheless, the heavy computational burdens impede the model-based voltage stability assessment (VSA) approaches from on-line applications.

In the past decade, the wide deployment of GPS-synchronized phasor measurement units (PMUs) shifts the interests of power industry to the measurement-based VSA. Thevenin equivalence (TE) method is one major approach for the measurement-based VSA. The core idea of TE method is to identify the TE based on measurement data provided by PMUs, i.e., $\tilde{V}_i, \tilde{I}_i$. With the identified TE, different voltage stability index (VSI) can be derived. Hence, the calculation of Thevenin equivalence is crucial in the VSA process. With respect to load area, one approach merges all the boundary buses in the load area into one fictitious bus and leverage the standard TE method to monitor the voltage stability. Other approaches extend the two-bus TE method to three-bus and n+1 bus equivalent system to consider the voltage stability within a load area. Besides of providing the voltage stability margin, the method could also compute the power transfer limit on a specified tie line.

Few of the aforementioned work has addressed the VSA for N−1 transmission contingency in real-time. However, the accurate estimation of the voltage stability margin for the foreseen N−1 contingencies, which is potentially implemented on-line, could enhance the situational awareness of the system operators. Another conventional system uses a hybrid approach to address the VSA for a series of N−1 contingencies. The post-contingency status is first estimated by leveraging the sensitivity method. Then the estimated operating states are treated as fictitious measurements from PMUs and the TE method is applied to achieve the voltage stability margin.

Another approach uses a sensitivity based Thevenin index (STI) to monitor the static long-term voltage stability, but does not address contingencies. The STI is based on wide area measurements and can be leveraged at the control center to validate the local Thevenin index (LTI) calculated by using measurements from a PMU.

SUMMARY OF THE INVENTION

In one aspect, a system to estimate the post-contingency operating points considering PV-PQ transitions is illustrated. A sensitivity based Thevenin index (STI) for each contingency is predicted using the estimated operating condition and the system determines voltage stability assessment (VSA) considering N−1 contingency. The approach leverages the sensitivity based Thevenin index (STI) which involves evaluating the Jacobian matrix at current operating condition.

In another aspect, the voltage stability in a power system considering N−1 contingency can be determined by:
 1) obtaining the current operating states $\bar{\theta}, \tilde{V}$;
 2) estimating post-contingency operating point $\theta_c, V_c$ for every considered contingency;
 3) if there is no PV-PQ transition following the contingency, calculate the corresponding sensitivities using equation (12); otherwise, obtain the sensitivities using equation (15);
 4) determining the STI for each considered contingency with equation (11).

Advantages of the preferred embodiments may include one or more of the following. The voltage stability assessment (VSA) considering N−1 contingency is presented. The presented approach has two major advantages over the existing methods: 1) compared to traditional approach such as continuation power flow (CPF) or time-domain simulation, the presented approach only involves solving several linear equations which significantly reduce the computational burden and make it promising for on-line implementation; 2) compared to the hybrid VSA method, the presented approach provides more accurate voltage stability margins which improves the situational awareness of the system operator. The approach leverages the STI which involves evaluating the Jacobian matrix at current operating condition. Since the N−1 contingency case is hypothetic, there is no information regarding the operating condition after a foreseen contingency. To address this issue, the post-contingency states are estimated based on current operating point. Numerical results based on IEEE 14-bus system demonstrate the accuracy of the preferred embodiment in predicting the voltage stability margin under contingency. Moreover, the on-line implementation of the preferred embodiment is promising since it only involves solving several linear equations.

Other features and advantages of the invention will be apparent from the following description of the preferred embodiments thereof, and from the claims.

BRIEF DESCRIPTIONS OF FIGURES

The subject matter that is regarded as the invention may be best understood by reference to the following description taken in conjunction with the accompanying drawing figures in which.

DETAILED DESCRIPTION

Methods to monitor the long-term voltage stability in power system are detailed next. The system provides a framework for monitoring the voltage stability margin considering N−1 transmission contingencies using sensitivity based Thevenin index (STI).

Other Nomenclatures used herein include:

i,j Index of buses.

$\Delta V, \Delta \theta$ Change of voltage magnitude and angle in two subsequent PMU measurements.

$Q^{min}, Q^{max}$ Minimum and maximum reactive power limits for a generator.

$V_i, \theta_i$ Voltage magnitude and angle at bus i.

$f(\theta, V)$ Active power injection expressions.

$g(\theta, V)$ Reactive power injection expressions.

The system works with power systems where buses may be of 3 types.

1. PQ bus—the real power |P| and reactive power |Q| are specified. It is also known as Load Bus. Generally, in a PQ bus, the generated real and reactive power will be assumed to be zero. However, power will be flowing out, thus, the injected real power and reactive power will be both negative.
2. PV bus—the real power |P| and the voltage magnitude |V| are specified. It is also known as Generator Bus. The real power and voltage are specified for buses that are generators. These buses have a constant power generation, controlled through a prime mover, and a constant bus voltage magnitude.
3. Slack bus—to balance the active and reactive power in the system. It is also known as the Reference Bus or the Swing Bus. The slack bus will serve as an angular reference for all other buses in the system, which is set to 0°. The voltage magnitude is also assumed to be 1 p.u. at the slack bus.

The slack bus provides or absorbs active and reactive power to and from the transmission system to provide for losses, since these variables are unknown until the final solution is established. The slack bus is the only bus for which the system reference phase angle is defined. From this, the various angular differences can be calculated in the power flow equations. If a slack bus is not specified, then a generator bus with maximum real power |P| acts as the slack bus. A given scheme can involve more than one slack bus. The most common formulation of the load flow problem specifies all input variables (PQ at loads, PV at generators) as deterministic values. Each set of specified values corresponds to one system state, which depends on a set of system conditions. When those conditions are uncertain, numerous scenarios must be analyzed.

Figure 1:
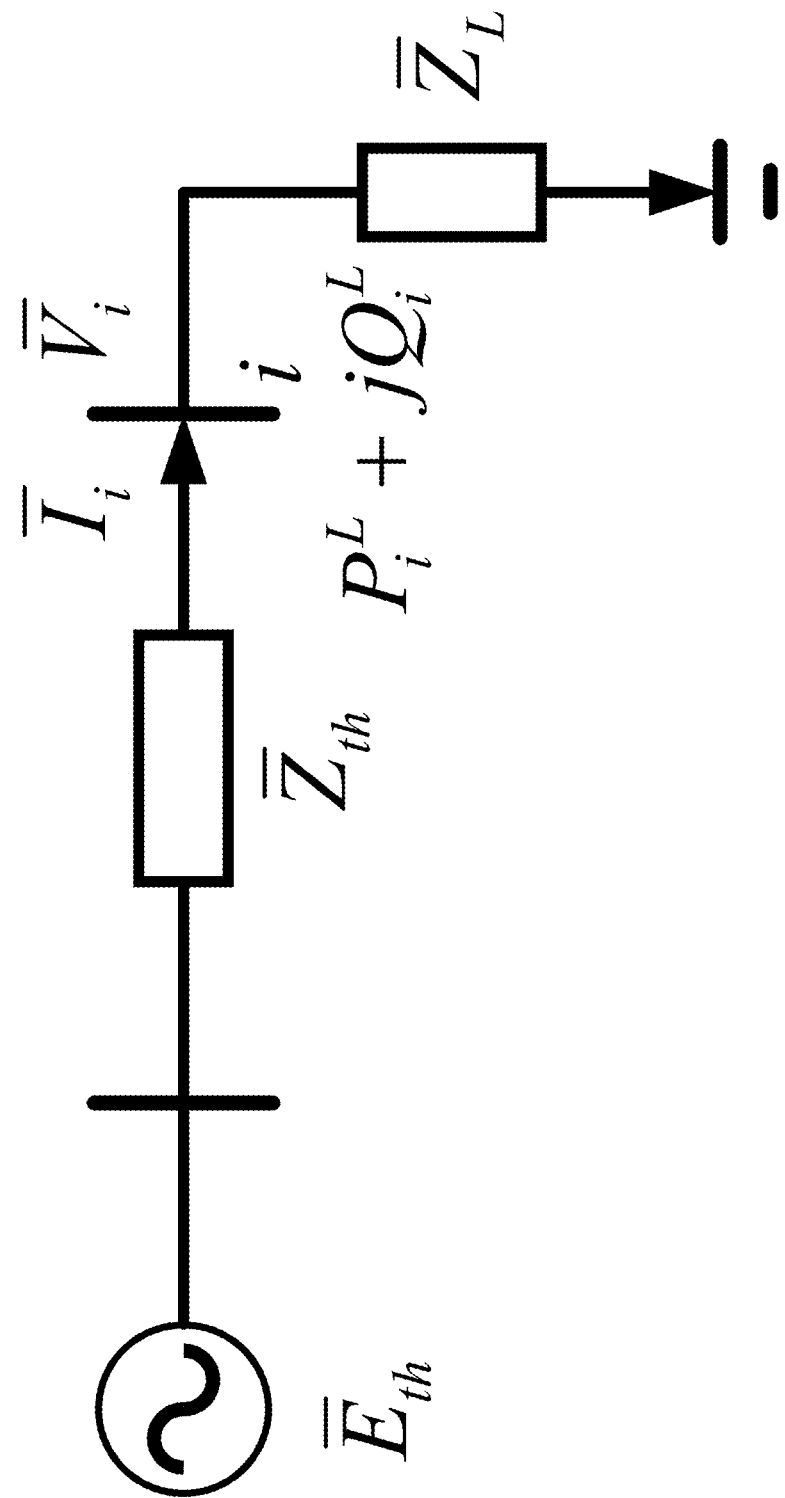
FIG. 1 shows an exemplary two-bus Thevenin equivalent system.

A sensitivity based Thevenin index is discussed next In FIG. 1, a two-bus system with a load bus i and the rest of the system represented by a Thevenin equivalence is provided. To estimate the Thevenin equivalence, i.e., $\overline{E}t_h$, $\overline{Z}_{th}$, at least two subsequent measurements are required with the assumption that the Thevenin equivalence remains the same during the time interval. Suppose we have two measurement sets at load bus i, i.e., $(\overline{V}_i^{(1)}, \overline{I}_i^{(1)}, \overline{S}_i^{L^{(1)}})$ and $(\overline{V}_i^{(2)}, \overline{I}_i^{(2)}, \overline{S}_i^{L^{(1)}}(1+\Delta\lambda))$, the following two equations hold:

$$\overline{E}_{th} = \overline{V}_i^{(1)} + \overline{Z}_{th} \overline{I}_i^{(1)} \qquad (1)$$

$$\overline{E}_{th} = \overline{V}_i^{(2)} + \overline{Z}_{th} \overline{I}_i^{(2)} \qquad (2)$$

Thus, $\overline{Z}_{th}$ can be calculated as:

$$\overline{Z}_{th} = -\frac{\overline{V}_i^{(2)} - \overline{V}_i^{(1)}}{\overline{I}_i^{(2)} - \overline{I}_i^{(1)}} = -\frac{\Delta \overline{V}_i}{\Delta \overline{I}_i} \qquad (3)$$

Based on the voltage stability index, the LTI can be expressed as the ratio between $\overline{Z}_{th}$ and the load impedance $\overline{Z}_L$:

$$LTI = \left|\frac{\overline{Z}_{th}}{\overline{Z}_L}\right| = \left|\frac{\Delta \overline{V}_i}{\overline{V}_i^{(1)}} \cdot \frac{\overline{I}_i^{(1)}}{\Delta \overline{I}_i}\right| \qquad (4)$$

By leveraging the polar form of the complex value and let $\overline{V}_i^{(1)} = Ve^{j\theta}, \overline{V}_i^{(2)} = (V+\Delta V)e^{j(\theta+\Delta\theta)}$, we can write $\Delta \overline{V}_i$ into:

$$\Delta \overline{V}_i = (V + \Delta V)e^{j(\theta+\Delta\theta)} - Ve^{j\theta} \qquad (5)$$
$$= \overline{V}_i^{(1)}((1+\Delta V/V)e^{j\Delta\theta} - 1)$$

In addition, $\Delta \overline{I}$, can be described by $$\Delta \overline{I}_i = \overline{I}_i^{(2)} - \overline{I}_i^{(1)} = \frac{\overline{S}_i^{L^{(1)*}}(1+\Delta\lambda)}{Ve^{-j(\theta+\Delta\theta)}} - \frac{\overline{S}_i^{L^{(1)*}}}{Ve^{(-j\theta)}} \qquad (6)$$
$$= \overline{I}_i^{(1)}\left(\frac{1+\Delta\lambda}{(1+\Delta V/V)e^{-j\theta}} - 1\right)$$

With (5) and (6), the ratio between $\overline{Z}t_h$ and $\overline{Z}_L$ can be derived as:

$$\frac{\overline{Z}_{th}}{\overline{Z}_L} = -\frac{(1+\Delta V/V)\cdot((1+\Delta V/V) - e^{-j\Delta\theta})}{1+\Delta\lambda - (1+\Delta V/V)e^{-j\Delta\theta}} \qquad (7)$$

Since $\Delta\theta$ is small, $e^{-j\Delta\theta} \approx 1 - j\Delta\theta$, the following equation can be obtained:

$$\frac{\overline{Z}_{th}}{\overline{Z}_L} = -\left(1+\frac{\Delta V}{V}\right) \cdot \frac{((1+\Delta V/V) - (1-j\Delta\theta))}{1+\Delta\lambda - (1+\Delta V/V)(1-j\Delta\theta)} \qquad (8)$$

In (8), $\Delta V$ is small compared to $$V, \frac{\Delta V}{V}$$

can be neglected in the first term. Similarly, the product of $\Delta V$ and $\Delta\theta$ is also small and can be dropped from the denominator in the second term. The simplified version of (8) can be described as:

$$\frac{\overline{Z}_{th}}{\overline{Z}_L} = -\frac{(\Delta V/V + j\Delta\theta)}{\Delta\lambda - \Delta V/V + j\Delta\theta} = -\frac{\left(\frac{\Delta V}{\Delta\lambda} \cdot \frac{1}{V} + j\frac{\Delta\theta}{\Delta\lambda}\right)}{1 - \frac{\Delta V}{\Delta\lambda} \cdot \frac{1}{V} + j\frac{\Delta\theta}{\Delta\lambda}} \quad (9)$$

Thus, the LTI can be formulated as a function of $\Delta\lambda$:

$$LTI(\Delta\lambda) = \left|\frac{\overline{Z}_{th}}{\overline{Z}_L}\right| = \sqrt{\frac{\left(\frac{\Delta V}{\Delta\lambda} \cdot \frac{1}{V}\right)^2 + \left(\frac{\Delta\theta}{\Delta\lambda}\right)^2}{\left(1 - \frac{\Delta V}{\Delta\lambda} \cdot \frac{1}{V}\right)^2 + \left(\frac{\Delta\theta}{\Delta\lambda}\right)^2}} \quad (10)$$

The assumption that the Thevenin equivalence remains unchanged during the time interval is only valid when the load increment $\Delta\lambda$ is very small. The idea LTI, i.e., STI, can be achieved by using the limit of (10) with $\Delta\lambda\to 0$:

$$STI = \lim_{\Delta\lambda\to 0} LTI(\Delta\lambda) = \sqrt{\frac{\left(\frac{dV}{d\lambda} \cdot \frac{1}{V}\right)^2 + \left(\frac{d\theta}{d\lambda}\right)^2}{\left(1 - \frac{dV}{d\lambda} \cdot \frac{1}{V}\right)^2 + \left(\frac{d\theta}{d\lambda}\right)^2}} \quad (11)$$

To obtain the STI, two sensitivity terms $dV/d\lambda$ and $d\theta/d\lambda$ should be calculated. The procedure can be interpreted as one predictor step of CPF when $d\lambda$ is selected to be the continuation parameter, which is provided in equation (12).

$$\begin{bmatrix} f_\theta & f_V & f_\lambda^P \\ g_\theta & g_V & g_\lambda^Q \\ 0 & 0 & 1 \end{bmatrix} \begin{bmatrix} d\theta \\ dV \\ d\lambda \end{bmatrix} = \begin{bmatrix} 0 \\ 0 \\ 1 \end{bmatrix} \quad (12)$$

In (12), $f_\theta, f_V, g_\theta, g_V$ represent the partial derivative of the active and reactive power injection expressions with respect to bus voltage magnitudes and angles, i.e., the standard Jacobian matrix in power flow analysis at an operating point. The term $f^P_\lambda, g^P_\lambda$ indicate the amount of active and reactive power injection changes as a function of $d\lambda$.

Equation (12) should be evaluated at an operating point to obtain the sensitivities. However, the foreseen N-1 contingencies are hypothetic and there is no information regarding the operating point. To address this issue, the post-contingency states are estimated based on current operating point. Then equation (12) is evaluated at the estimated operating point to achieve the sensitivities and further the STI for each contingency.

The preferred embodiment addresses the voltage stability assessment (VSA) considering contingency. The approach leverages the sensitivity based Thevenin index (STI) which involves evaluating the Jacobian matrix at current operating condition. Since the contingency case is hypothetic, there is no information regarding the operating condition after a foreseen contingency. The preferred embodiment first estimates the post-contingency operating point as well as possible PV-PQ transitions based on the current operating point. Then the STI for each contingency can be predicted using the estimated operating condition. Numerical results based on IEEE 14-bus system demonstrate the accuracy of the preferred embodiment in predicting the voltage stability margin under contingency. Moreover, the on-line implementation of the preferred embodiment is promising since it only involves solving several linear equations.

A. Estimation of Post-Contingency Operating States

The system estimates the operating point after a foreseen transmission contingency. The core idea is provided in FIG. 2.

Figure 2:
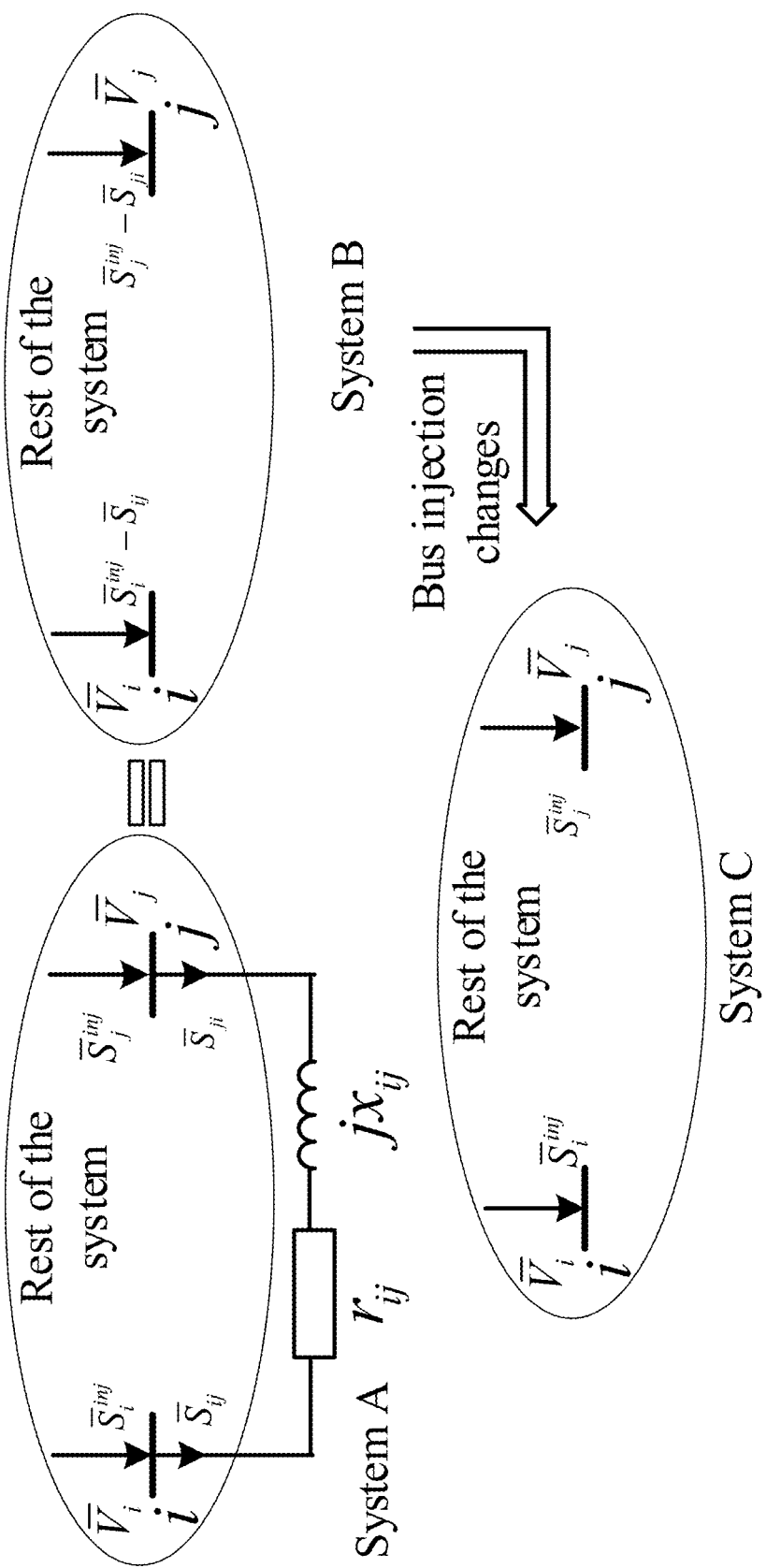
FIG. 2 shows an exemplary System transformation.

As shown in FIG. 2, system A represents the power network in base operating condition, where $\overline{S}_i^{inj}$ and $\overline{S}_{ij}$ indicate the net power injection at bus i and line flow from bus i to bus j, respectively. Similar description applies to $\overline{S}_j^{inj}$ and $\overline{S}_{ji}$. The difference between system A and system B lies in two parts: 1) system B does not have branch ij; 2) the net power injections at bus i and j of system B are changed to be $\overline{S}_i^{inj}-\overline{S}_{ij}$ and $\overline{S}_j^{inj}-\overline{S}_{ji}$, respectively. System A and B are equivalent and have the same power flow results. The post-contingency system, i.e., branch ij in outage, is provided as system C. Compared to system B, the power injections at bus i and j are changed by the amount of $\overline{S}_{ij}$ and $\overline{S}_{ji}$. Thus, the post-contingency operating states can be calculated as:

$$\begin{bmatrix} \theta_c \\ V_c \end{bmatrix} = \begin{bmatrix} \tilde{\theta} \\ \tilde{V} \end{bmatrix} \begin{bmatrix} f_\theta & f_V \\ g_\theta & g_V \end{bmatrix}^{-1} \Delta F_{inj} \quad (13)$$

where $(\tilde{\theta}, \tilde{V})$ is the operating point under base case; $(\theta_c, V_c)$ is the operating point following a contingency; $\Delta F_{inj}$ is the vector containing the active and reactive bus injection changes which are numerically equal to the active and reactive line flow on the outage branch. In one embodiment, the Jacobian matrix in (13) is constructed based on the topology of system B, i.e., the contingency line ij is in outage When a severe transmission contingency occurs, some generators may reach their reactive power limits and the corresponding bus type will change from PV to PQ. To both accurately estimate the post-contingency states and the voltage stability margin, it is paramount to predict the possible PV-PQ transitions. The piecewise linear sensitivity method is used to predict the Q limits violation. First, a K factor which reflects the severity of reactive power violation at a PV bus is defined as $$K = \begin{cases} \dfrac{Q^{max} - \tilde{Q}^{(l)}}{Q^{(l+1)} - \tilde{Q}^{(l)}}, & Q^{(l+1)} \geq Q^{max} \\ 1, & Q^{min} \leq Q^{(l+1)} \leq Q^{max} \\ \dfrac{\tilde{Q}^{(l)} - Q^{min}}{\tilde{Q}^{(l)} - Q^{(l+1)}}, & Q^{l+1} \leq Q^{min} \end{cases} \quad (14)$$

The complete process is provided as below:
1) Set l=0 and obtain the power flow results, $\tilde{\theta}^{(l)}, \tilde{V}^{(l)}, \tilde{Q}^{(l)}$, in base operating condition, i.e., before the contingency.
2) Apply $\Delta F_{inj}^{(l)}$ to system l and leverage equation (13) to predict the system l+1 states $\theta^{(l+1)}, V^{(l+1)}, Q^{(l+1)}$.
3) Calculate K factor for all the PV buses. If the values of all K are equal to 1 or there is no PV bus, go to step 6); otherwise, go to step 4).
4) Find the PV bus with the lowest K, say bus i with $K_i$. Apply a portion of $\Delta F_{inj}^{(l)}$, i.e., $K_i\Delta F_{inj}^{(l)}$ to system l to predict the intermediate system l+1 states $\tilde{\theta}^{(l+1)}, \tilde{V}^{(l+1)}, \tilde{Q}^{(l+1)}$.
5) Change bus i to PQ bus by fixing its reactive power generation to its limit. Let $\Delta F_{inj}^{(l+1)}=(1-K_i)\Delta F_{inj}^{(l)}$, set l=l+1 and go to step 2).
6) Output the predicted final states $\theta^{(l+1)}, V^{(l+1)}, Q^{(l+1)}$.

B. Implementation of the VSA Embodiment

With the post-contingency states, the STI under each transmission contingency can be predicted. However, equation (12) should be modified to calculate the corresponding sensitivities when there are generators reaching their limits. As an example, suppose bus i is transformed from PV bus to PQ bus. Equation (12) is modified as follows $$\begin{bmatrix} f_\theta & f_V & f_{V_i} & f_\lambda^P \\ g_\theta & g_V & g_{V_i} & g_\lambda^Q \\ g_\theta^i & g_V^i & g_{V_i}^i & g_\lambda^{Q,i} \\ 0 & 0 & 0 & 1 \end{bmatrix} \begin{bmatrix} d\theta \\ dV \\ dV_i \\ d\lambda \end{bmatrix} = \begin{bmatrix} 0 \\ 0 \\ 0 \\ 1 \end{bmatrix} \quad (15)$$

Since $V_i$ becomes a variable, one column and row should be added to the previous Jacobian. For the added row, $g_\theta^i, g_V^i, g_{V_i}^i$, represent the partial derivative of reactive power injection expressions at bus i with respect to θ, V and $V_j$. In one embodiment, if bus i does not have any load, $g_\lambda^{Q,i}$ is equal to zero because the reactive limit of the generator at that bus is reached; otherwise, the value of $g_\lambda^{Q,i}$ depends on how will the reactive load varies as dλ changes. Equation (15) can be easily extended for any number of PV-PQ bus transitions.

Figure 3:
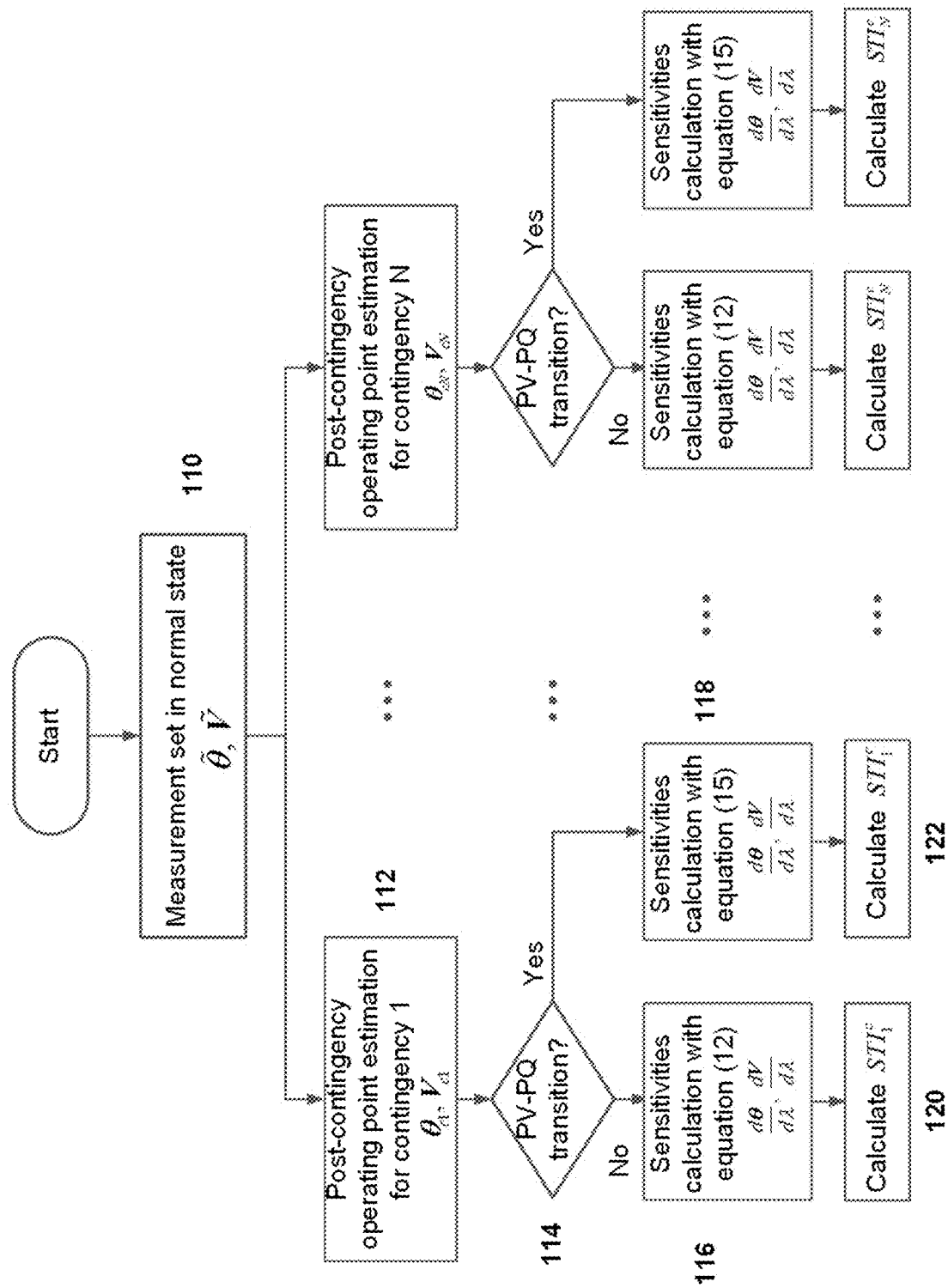
FIG. 3 shows an exemplary Flowchart of the proposed VSA approach.

The flowchart of the preferred embodiment is depicted in FIG. 3. The procedures are described as below (note that the number shown in the figure is clearly defined in the procedures):

1) Obtain the current operating states $\tilde{\theta}, \tilde{V}$ [110].
2) Estimate the post-contingency operating point $\theta_c, V_c$ for every considered contingency with the method presented above [112].
3) If there is no PV-PQ transition following the contingency [114], calculate the corresponding sensitivities using equation (12) [116]; otherwise, obtain the sensitivities using equation (15) [118].
4) Calculate the STI for each considered contingency with equation (11) [120,122].

This system determines the voltage stability assessment (VSA) considering N−1 contingency using sensitivity based Thevenin index (STI) which involves evaluating the Jacobian matrix at current operating condition. Since the N−1 contingency case is hypothetic, there is no information regarding the operating condition after a foreseen contingency. The preferred embodiment first estimates the post-contingency operating point as well as possible PV-PQ transitions based on the current operating point. Then the STI for each contingency can be predicted using the estimated operating condition. Numerical results based on IEEE 14-bus system demonstrate the accuracy of the preferred embodiment in predicting the voltage stability margin under contingency. Moreover, the on-line implementation of the preferred embodiment is promising since it only involves solving several linear equations.

In one embodiment, the calculation of STI for each contingency and load bus is independent so the computational speed can be enhanced if parallelization technique is leveraged.

Exemplary case studies are presented next. The IEEE-14 bus system provided in MATPOWER software package is selected to test the performance of the proposed VSA approach. It includes five generators, 14 buses and 20 transmission branches. Since the data only gives one load pattern, we assume that load profile as normal load level, whose active and reactive loads are 259 MW and 73.5 MVAr, respectively. It is also assumed that under peak load level, the active and reactive loads are 1.2 times the values in normal load level. We consider all the N−1 branch outages except the following two branches:

line 1-2 is a key transmission element whose loss will cause the divergence of power flow under normal load pattern;

line 7-8 only connects a generator bus in one end whose loss will cause islanding system.

First, we implement the preferred embodiment under normal load condition. Table I provides the VSI, i.e., $|Z_{th}|/|Z_L|$, at every load bus for two critical contingencies. The STI* denotes the benchmark results, which are calculated based on exact post-contingency power flow solutions. We compare the accuracy of the preferred embodiment with existing solutions where the VSI is based on the voltage magnitude deviation. To accommodate the comparison, we shift the VSI to $|Z_{th}|/|Z_L|$. Nevertheless, we leverage the same method as done conventionally to identify the post-contingency TE. The last row in Table I, i.e., σ, denotes the average relative error (averaged among all load buses) of the two approaches with respect to the benchmark results. As can be observed from Table I, under the normal load level, the preferred embodiment provides more accurate results than conventional systems for every load bus. The average errors of the proposed method are only 0.31% and 0.96% for contingency 1-5 and 5-6, which are far less than 5.32% and 5.41% given by the conventional system.

Figure 4:
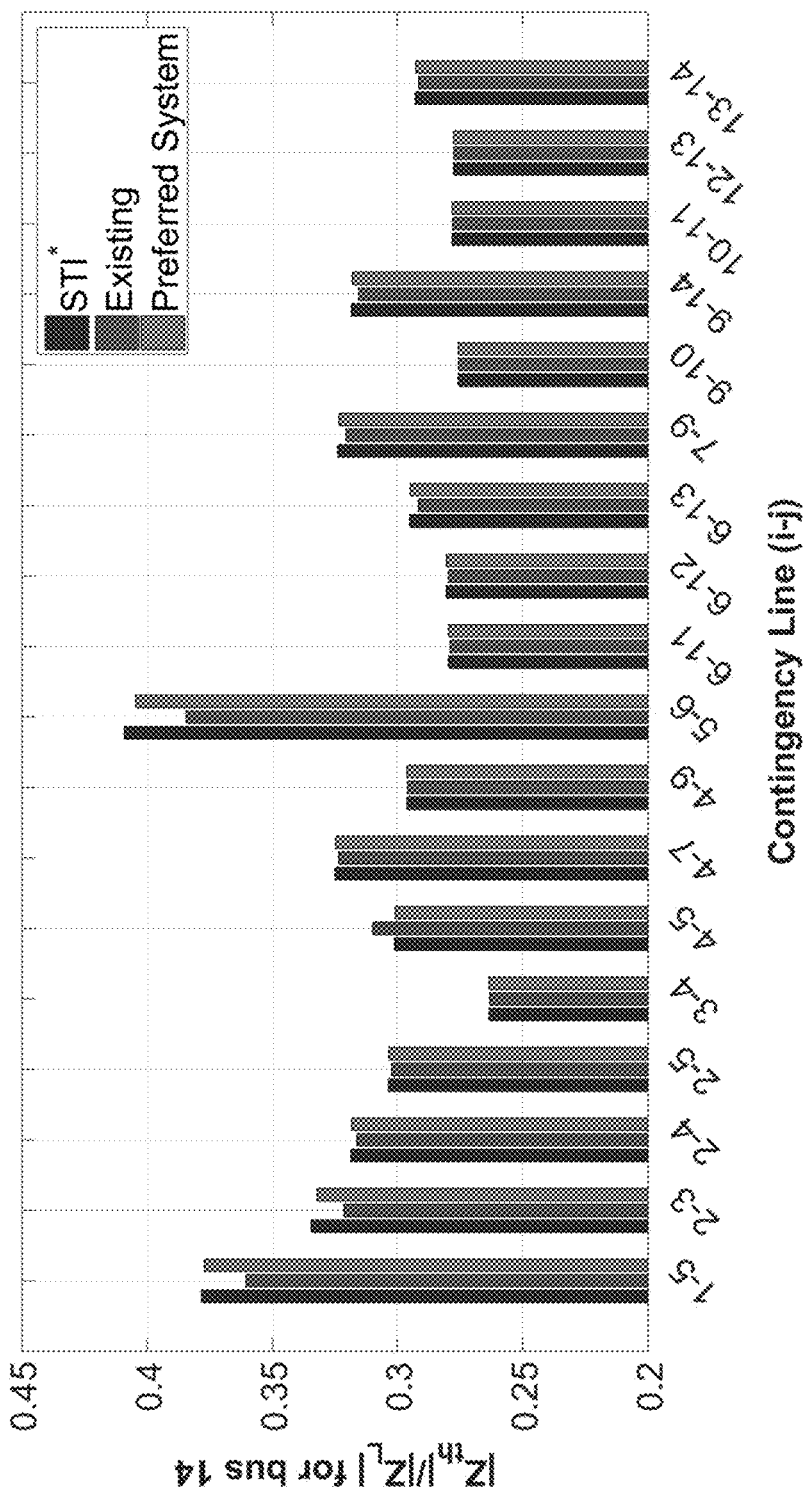
FIG. 4 shows a sample VSI for different contingencies at bus 14 under normal load level.

FIG. 4 depicts the VSIs for all the 18 contingencies at bus 14, which is the critical load bus. The VSI at bus 14 for the base case, i.e., without outage, is 0.2771. It can be seen that the majority of the predicted post-contingency VSI are higher than 0.2771, which indicates that the voltage stability margin will decrease if those contingencies occur. In one embodiment, if the VSI exceeds 0.45, alarms will be sent to the control center for situational awareness. Under the normal load level, no alarms will be triggered for bus 14 since the predicted post-contingency VSIs are all below 0.45. Also, the preferred embodiment outperforms conventional systems for better estimation of the post-contingency VSI by using the novel framework for monitoring the voltage stability margin considering N−1 transmission contingencies using STI and solving several linear equations, which makes it promising for on-line implementation.

TABLE I

COMPARISON OF VSI UNDER NORMAL LOAD LEVEL

| | Contingency Line (i-j) | | | | | |
| --- | --- | --- | --- | --- | --- | --- |
| | 1-5 | | | 5-6 | | |
| Bus | STI* | Conventional | Preferred Embodiment | STI* | Conventional | Preferred Embodiment |
| 4 | 0.2874 | 0.2704 | 0.2865 | 0.1976 | 0.1948 | 0.1969 |
| 5 | 0.2780 | 0.2591 | 0.2770 | 0.1570 | 0.1551 | 0.165 |
| 9 | 0.3590 | 0.3417 | 0.3579 | 0.3577 | 0.3415 | 0.3544 |
| 10 | 0.3638 | 0.3461 | 0.3627 | 0.3763 | 0.3565 | 0.3725 |
| 11 | 0.3695 | 0.3506 | 0.3684 | 0.4085 | 0.3788 | 0.4036 |

TABLE I-continued

COMPARISON OF VSI UNDER NORMAL LOAD LEVEL

| | Contingency Line (i-j) | | | | | |
|---|---|---|---|---|---|---|
| | 1-5 | | | 5-6 | | |
| Bus | STI* | Conventional | Preferred Embodiment | STI* | Conventional | Preferred Embodiment |
| 12 | 0.3821 | 0.3622 | 0.3809 | 0.4443 | 0.4045 | 0.4381 |
| 13 | 0.3797 | 0.3601 | 0.3785 | 0.4401 | 0.4024 | 0.4342 |
| 14 | 0.3784 | 0.3606 | 0.3773 | 0.4092 | 0.3845 | 0 4046 |
| σ (%) | — | 5.32 | 0.31 | — | 5.41 | 0.96 |

Next, we test the preferred embodiment for the peak load condition. In Table II, the VSI at every load bus for two critical contingencies are provided. Still, the preferred embodiment gives more accurate results in predicting the post-contingency VSI. For contingency 1-5, the average error σ is 24.82% by using the conventional system. This value decreases to 4.25% by leveraging the preferred embodiment.

TABLE II

COMPARISON OF VSI UNDER PEAK LOAD LEVEL

| | Contingency Line (i-j) | | | | | |
|---|---|---|---|---|---|---|
| | 1-5 | | | 5-6 | | |
| Bus | STI* | Conventional | Preferred Embodiment | STI* | Conventional | Preferred Embodiment |
| 4 | 0.4694 | 0.3345 | 0.4474 | 0.3674 | 0.2081 | 0.3260 |
| 5 | 0.4585 | 0.3111 | 0.4358 | 0.3054 | 0.1642 | 0.2692 |
| 9 | 0.5705 | 0.4389 | 0.5471 | 0.6055 | 0.4229 | 0.5395 |
| 10 | 0.5759 | 0.4441 | 0.5524 | 0.6323 | 0.3477 | 0.5642 |
| 11 | 0.5719 | 0.4377 | 0.5484 | 0.6739 | 0.3784 | 0.6022 |
| 12 | 0.5795 | 0.4441 | 0.5557 | 0.7154 | 0.3555 | 0.6413 |
| 13 | 0.5817 | 0.4473 | 0.5581 | 0.7107 | 0.3566 | 0.6370 |
| 14 | 0.5970 | 0.4666 | 0.5734 | 0.6748 | 0.3669 | 0.6047 |
| σ (%) | — | 24.82 | 4.25 | — | 48.25 | 10.82 |

Figure 5:
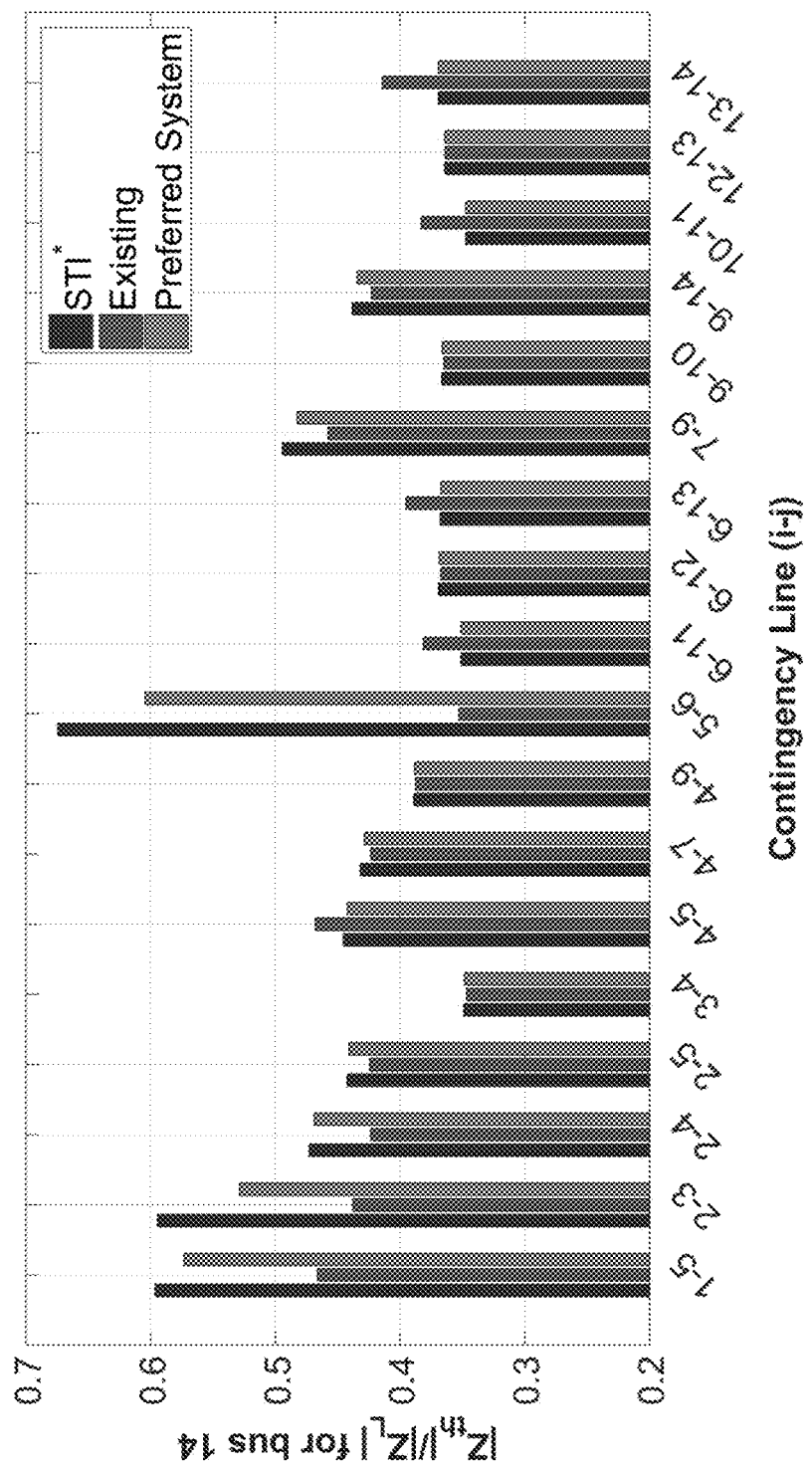
FIG. 5 shows an exemplary VSI for different contingencies at bus 14 under peak load level.
Figure 6:
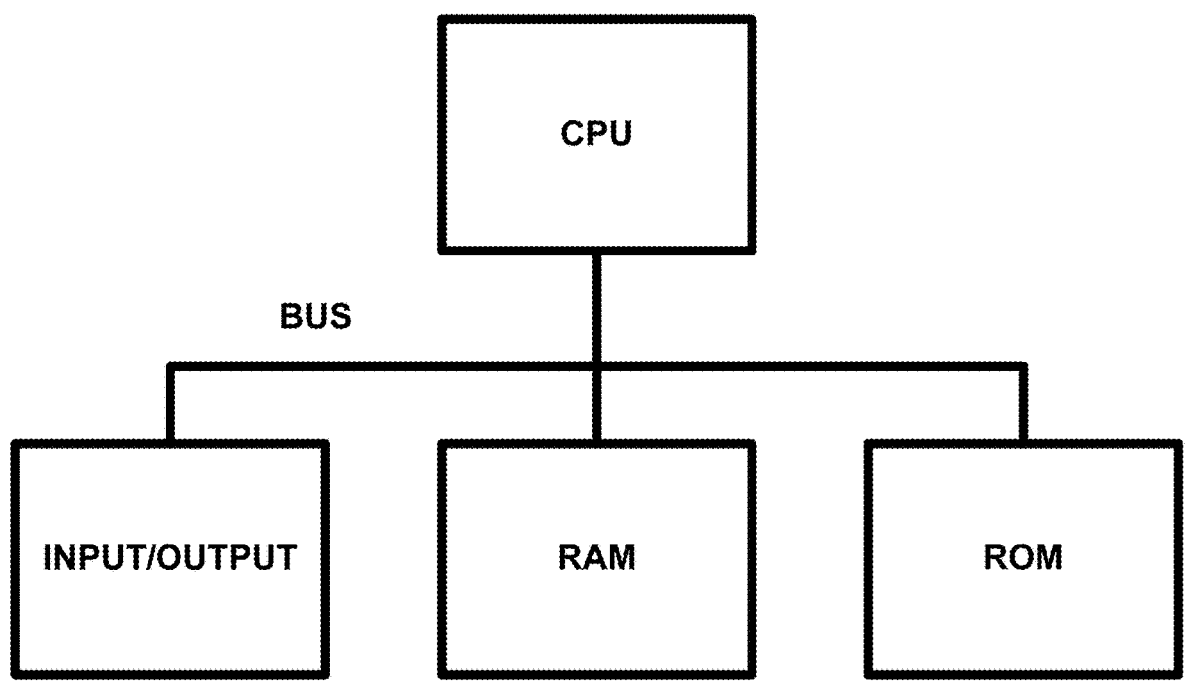
FIG. 6 shows one embodiment computer that host the application.

FIG. 5 provides the VSIs for different contingencies at bus 14 under peak load level. As can be seen from FIG. 5, for every contingency, the VSI calculated by the preferred embodiment is closer to the benchmark results than the VSI given conventional system. The largest difference between the benchmark results and the predicted VSIs occurs in contingency 5-6, where the benchmark VSI is 0.6748 and an alarm should be signaled. The preferred embodiment calculates the VSI as 0.6047, which still allows the generation of alarm. However, the conventional system outputs 0.3669 for the VSI, which will not signal any alarm. In addition, the VSI for contingency 1-5, 2-3, 2-4, 5-6 and 7-9 are above 0.45. Thus, the corresponding alarms are generated to trigger some preventive controls, which improves the system operator's situational awareness on the criticality of the current operating condition.

The invention may be implemented in hardware, firmware or software, or a combination of the three. Preferably the invention is implemented in a computer program executed on a programmable computer having a processor, a data storage system, volatile and non-volatile memory and/or storage elements, at least one input device and at least one output device.

By way of example, a block diagram of a computer to support the system is discussed next in FIG. 7. The computer preferably includes a processor, random access memory (RAM), a program memory (preferably a writable read-only memory (ROM) such as a flash ROM) and an input/output (I/O) controller coupled by a CPU bus. The computer may optionally include a hard drive controller which is coupled to a hard disk and CPU bus. Hard disk may be used for storing application programs, such as the present invention, and data. Alternatively, application programs may be stored in RAM or ROM. I/O controller is coupled by means of an I/O bus to an I/O interface. I/O interface receives and transmits data in analog or digital form over communication links such as a serial link, local area network, wireless link, and parallel link. Optionally, a display, a keyboard and a pointing device (mouse) may also be connected to I/O bus. Alternatively, separate connections (separate buses) may be used for I/O interface, display, keyboard and pointing device. Programmable processing system may be preprogrammed or it may be programmed (and reprogrammed) by downloading a program from another source (e.g., a floppy disk, CD-ROM, or another computer).

Each computer program is tangibly stored in a machine-readable storage media or device (e.g., program memory or magnetic disk) readable by a general or special purpose programmable computer, for configuring and controlling operation of a computer when the storage media or device is read by the computer to perform the procedures described herein. The inventive system may also be considered to be embodied in a computer-readable storage medium, configured with a computer program, where the storage medium so configured causes a computer to operate in a specific and predefined manner to perform the functions described herein.

The invention has been described herein in considerable detail in order to comply with the patent Statutes and to provide those skilled in the art with the information needed to apply the novel principles and to construct and use such specialized components as are required. However, it is to be understood that the invention can be carried out by specifically different equipment and devices, and that various modifications, both as to the equipment details and operating procedures, can be accomplished without departing from the scope of the invention itself.

In sum, our approach based on STI addresses the VSA considering a series of foreseen transmission N−1 contingencies. The wide area measurements based STI is interpreted as an idea LTI and can be calculated by evaluating the Jacobian matrix at current operating condition. To extend its application in monitoring the voltage stability margin for N−1 contingencies, the post-contingency operating point as well as the PV-PQ transitions are first estimated based on the current operating condition. Then the estimated operating point is used to calculate the STI for each N−1 contingency. Numerical case studies based on the IEEE 14-bus system demonstrate the effectiveness of the preferred embodiment and its benefits in the situational awareness enhancement.

The foregoing has described a measurement-based voltage stability monitoring and control scheme. While specific embodiments of the present invention have been described, it will be apparent to those skilled in the art that various modifications thereto can be made without departing from the spirit and scope of the invention. Accordingly, the foregoing description of the preferred embodiment of the invention and the best mode for practicing the invention are provided for the purpose of illustration only and not for the purpose of limitation.

What is claimed is:

1. A method for determining long-term voltage stability in a power system, comprising:
   estimating post-contingency operating point(s) of the power system considering PV-PQ transitions based on the current operating point;
   predicting a sensitivity based Thevenin index (STI) for each contingency using the estimated operating condition; and
   determining a voltage stability assessment (VSA) considering N−1 contingency, wherein the current operating states $\tilde{\theta}, \tilde{V}$, further comprising determining post-contingency operating states as:

$$\begin{bmatrix} \theta_c \\ V_c \end{bmatrix} = \begin{bmatrix} \tilde{\theta} \\ \tilde{V} \end{bmatrix} \begin{bmatrix} f_\theta & f_V \\ g_\theta & g_V \end{bmatrix}^{-1} \Delta F_{inj}$$

where $(\tilde{\theta}, \tilde{V})$ is an operating point under base case; $(\theta_c, V_c)$ is an operating point following a contingency; $\Delta F_{inj}$ is a vector containing the active and reactive bus injection changes which are numerically equal to the active and reactive line flow on an outage branch; $f_\theta$ and $f_V$ represents the partial derivative of active power injection expression with respect to voltage angle θ and voltage magnitude V; $g_\theta$ and $g_V$ denotes the partial derivative of reactive power injection expression with respect to voltage angle θ and voltage magnitude V; and
   operating a power generator adapted to be connected to a power grid and controlled by a processor.

2. The method of claim 1, further comprising:
   obtaining current operating states;
   estimating a post-contingency operating point $\theta_c, V_c$ for every considered contingency, where $\theta_c$ and $V_c$ represent the predicted bus voltage angle and bus voltage magnitude after a contingency;
   determining corresponding sensitivities based on the presence of PV-PQ transition following the contingency; and
   determining the STI for each considered contingency.

3. The method of claim 1, comprising estimating an operating point after a foreseen transmission contingency.

4. The method of claim 1, comprising construction of a Jacobian matrix based on a system topology with a contingency line ij in an outage.

5. The method of claim 1, comprising determining corresponding sensitivities as one predictor step of continuation of power flow (CPF) when dλ is a continuation parameter with:

$$\begin{bmatrix} f_\theta & f_V & f_\lambda^P \\ g_\theta & g_V & g_\lambda^Q \\ 0 & 0 & 1 \end{bmatrix} \begin{bmatrix} d\theta \\ dV \\ d\lambda \end{bmatrix} = \begin{bmatrix} 0 \\ 0 \\ 1 \end{bmatrix}$$

where dλ represents the load increment; dθ and dV denote the change of voltage angle and voltage magnitude respectively; $f^P_\lambda, g^P_\lambda$ indicate the amount of active and reactive power injection change as a function of dλ.

6. The method of claim 5, comprising obtaining sensitivities when there are generators reaching their reactive power limit after the contingency as:

$$\begin{bmatrix} f_\theta & f_V & f_{V_i} & f_\lambda^P \\ g_\theta & g_V & g_{V_i} & g_\lambda^Q \\ g_\theta^i & g_V^i & g_{V_i}^i & g_\lambda^{Q,i} \\ 0 & 0 & 0 & 1 \end{bmatrix} \begin{bmatrix} d\theta \\ dV \\ dV_i \\ d\lambda \end{bmatrix} = \begin{bmatrix} 0 \\ 0 \\ 0 \\ 1 \end{bmatrix}$$

where bus i is the bus which transforms from PV bus to PQ bus; $f_{V_i}$ is the partial derivative of active power injection expression at other PV and PQ buses with respect to bus voltage magnitude at bus i, i.e., $V_i$; $g_{V_i}$ is the partial derivative of reactive power injection expression at other PQ buses with respect to bus $V_i$; $g_\theta^i$, $g_V^i$, $g_{V_i}^i$, represent the partial derivative of reactive power injection expressions at bus i with respect to θ,V and $V_i$; $g_\lambda^{Q,i}$ is the partial derivative of reactive power injection expression at bus i with respect to the load scaling factor A.

7. The method of claim 1, comprising determining STI for each contingency and load bus in parallel.

8. The method of claim 1, comprising determining a plurality of contingencies in parallel.

9. A system to control a power system, comprising:
   a power generator;
   a power grid coupled to the power generator; and
   a processor to control the power grid with code for:
      estimating post-contingency operating point(s) of the power system considering PV-PQ transitions based on the current operating point;
      predicting a sensitivity based Thevenin index (STI) for each contingency using the estimated operating condition;
      determining a voltage stability assessment (VSA) considering N−1 contingency; and
      determining corresponding sensitivities as one predictor when dλ is a continuation parameter with:

$$\begin{bmatrix} f_\theta & f_V & f_\lambda^P \\ g_\theta & g_V & g_\lambda^Q \\ 0 & 0 & 1 \end{bmatrix} \begin{bmatrix} d\theta \\ dV \\ d\lambda \end{bmatrix} = \begin{bmatrix} 0 \\ 0 \\ 1 \end{bmatrix}$$

where $d\lambda$ represents the load increment, $d\theta$ and $dV$ denote the change of voltage angle and voltage magnitude respectively, $f^P_\lambda, g^P_\lambda$ indicate the amount of active and reactive power injection changes as a function of $d\lambda$; and where $f_\theta$ and $f_V$ represents the partial derivative of active power injection expression with respect to voltage angle $\theta$ and voltage magnitude $V$–$g_\theta$ and $g_V$ denotes the partial derivative of reactive power injection expression with respect to voltage angle $\theta$ and voltage magnitude $V$.

10. The system of claim 4, further comprising code for:

obtaining current operating states;

estimating a post-contingency operating point $\theta_c, V_c$ considering the presence of PV-PQ transition for every considered contingency;

determining corresponding sensitivities following the contingency; and determining the STI for each considered contingency.

11. The system of claim 9, comprising code for obtaining sensitivities when there are PV-PQ transitions as:

$$\begin{bmatrix} f_\theta & f_V & f_{V_i} & f^P_\lambda \\ g_\theta & g_V & g_{V_i} & g^Q_\lambda \\ g^i_\theta & g^i_V & g^i_{V_i} & g^{Q,i}_\lambda \\ 0 & 0 & 0 & 1 \end{bmatrix} \begin{bmatrix} d\theta \\ dV \\ dV_i \\ d\lambda \end{bmatrix} = \begin{bmatrix} 0 \\ 0 \\ 0 \\ 1 \end{bmatrix}$$

where bus i is the bus which transforms from PV bus to PQ bus; $f_{V_i}$ is the partial derivative of active power injection expression at other PV and PQ buses with respect to bus voltage magnitude at bus i, i.e., $V_i$; $g_{V_i}$ is the partial derivative of reactive power injection expression at other PQ buses with respect to bus $V_i$; $g_\theta^i, g_V^i, g_{V_i}^i$ represent the partial derivative of reactive power injection expressions at bus i with respect to $\theta, V$ and $V_i$; $g_\lambda^{Q,i}$ is the partial derivative of reactive power injection expression at bus i with respect to the load scaling factor $\lambda$.

12. The system of claim 9, comprising code for determining STI for each contingency and load bus in parallel.

13. The system of claim 9, comprising code for determining a plurality of contingencies in parallel.

* * * * *